United States Patent
Hass et al.

(10) Patent No.: US 10,851,452 B2
(45) Date of Patent: Dec. 1, 2020

(54) METHODS FOR EVAPORATING AND DEPOSITING HIGH VAPOR PRESSURE MATERIALS

(71) Applicant: Directed Vapor Technologies International, Inc., Charlottesville, VA (US)

(72) Inventors: Derek Hass, Charlottesville, VA (US); Daniel Lobo, Charlottesville, VA (US); Daniel Christy, Charlottesville, VA (US)

(*) Notice: Subject to any disclaimer, the term of this patent is extended or adjusted under 35 U.S.C. 154(b) by 213 days.

(21) Appl. No.: 15/705,194

(22) Filed: Sep. 14, 2017

(65) Prior Publication Data
US 2018/0073130 A1    Mar. 15, 2018

Related U.S. Application Data

(60) Provisional application No. 62/394,732, filed on Jun. 14, 2016.

(51) Int. Cl.
| C23C 14/32 | (2006.01) |
| H01M 10/052 | (2010.01) |
| C23C 14/06 | (2006.01) |
| C23C 14/30 | (2006.01) |
| C23C 14/00 | (2006.01) |
| H01M 10/0562 | (2010.01) |
| C23C 14/22 | (2006.01) |

(52) U.S. Cl.
CPC ......... *C23C 14/32* (2013.01); *C23C 14/0021* (2013.01); *C23C 14/06* (2013.01); *C23C 14/0676* (2013.01); *C23C 14/228* (2013.01); *C23C 14/30* (2013.01); *H01M 10/052* (2013.01); *H01M 10/0562* (2013.01); *H01M 2300/0068* (2013.01)

(58) Field of Classification Search
CPC ....... C23C 16/30; C23C 16/308; C23C 16/34; C23C 14/30; C23C 14/32; C23C 14/0676
See application file for complete search history.

(56) References Cited

U.S. PATENT DOCUMENTS

| 2006/0257314 A1* | 11/2006 | Natarajan | ................. | B01J 7/02 |
| | | | | 423/657 |
| 2010/0242265 A1* | 9/2010 | Wadley | ................. | H01M 6/40 |
| | | | | 29/623.5 |

(Continued)

OTHER PUBLICATIONS

Kim, Yoon Gu, et al., "Plasma-assisted deposition of lithium phosphorus oxynitride films: Substrate bias effects". Journal of Power Sources, 187 (2009) 591-598.*

(Continued)

*Primary Examiner* — Bret P Chen
(74) *Attorney, Agent, or Firm* — Dale Jensen, PLC; Dale Jensen

(57) ABSTRACT

A method is disclosed, which can comprise via a transonic gas jet, depositing a thin film of LiPON on a substrate via a directed vapor deposition process. The transonic gas jet transports a thermally evaporated vapor cloud comprising the LiPON, wherein the transonic gas jet comprises one of (a) substantially entirely nitrogen ($N_2$) gas; or (b) nitrogen ($N_2$) gas as a dopant in a concentration greater than 10% by volume in an inert carrier gas.

13 Claims, 18 Drawing Sheets

(56) References Cited

U.S. PATENT DOCUMENTS

2012/0258022 A1\* 10/2012 Hughes .................. C03B 32/00
422/291
2013/0129938 A1\* 5/2013 Hass ..................... C23C 14/024
427/569

OTHER PUBLICATIONS

Kozen, Alexander C., et al., "Atomic Layer Deposition of the Solid Electrolyte LiPON". Chemistry of Materials, 2015, 27, 5324-5331.\*

Nowak, Susann, et al., "Ultra-thin LiPON films—Fundamental properties and application in solid state thin film model batteries". Journal of Power Sources 275 (2015) 144-150.\*

Su, Yurong, et al., "LiPON thin films with high nitrogen content for application in lithium batteries and electrochromic devices prepared by RF magnetron sputtering". Solid State Ionics, 282 (2015) 63-69.\*

\* cited by examiner

16000

16100

METHODS FOR EVAPORATING AND DEPOSITING HIGH VAPOR PRESSURE MATERIALS

CROSS-REFERENCES TO RELATED APPLICATIONS

This application claims priority to, and incorporates by reference herein in its entirety, U.S. Provisional Patent Application Ser. No. 62/394,732, filed Sep. 14, 2016.

BRIEF DESCRIPTION OF THE DRAWINGS

A wide variety of potential practical and useful embodiments will be more readily understood through the following detailed description of certain exemplary embodiments, with reference to the accompanying exemplary drawings in which.

DETAILED DESCRIPTION

Figure 1:
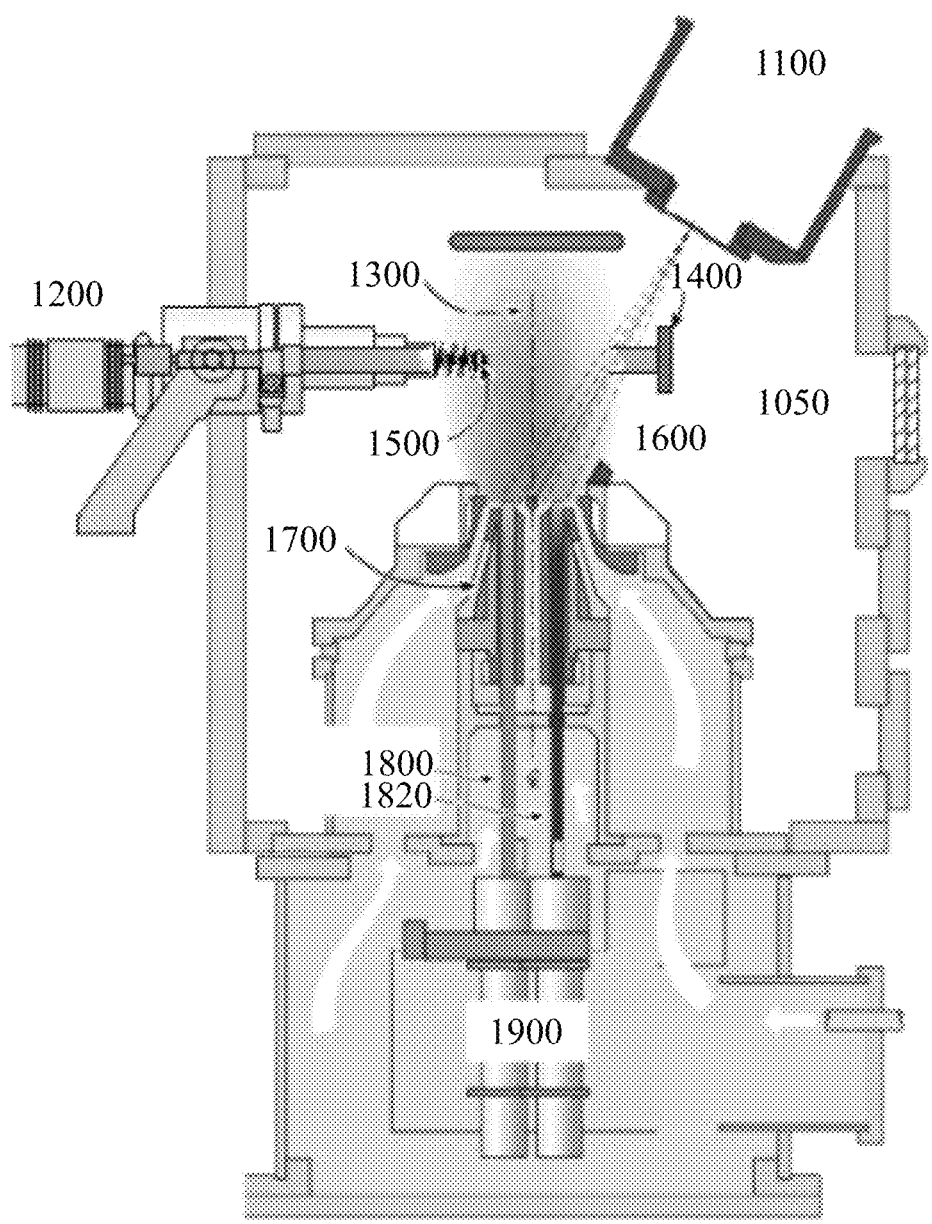
FIG. 1 is a block diagram of an exemplary embodiment of a system 1000.

The continuous advancement of science and technology has increased the requirements for portable electricity and, as a result, the development new methods of generating and storing energy are a critical, growing need in a vast number of commercial and military needs. Advanced batteries are therefore an active field of research, with a large amount of work currently focusing on lithium-based batteries due to their high theoretical energy density and promising laboratory results. Many different Li-based systems have been developed, but commercialization has been slow due to technical and economical challenges including safety, life-cycle achievement, energy density achieved and adequate packaging technology. A battery is an electrochemical cell, or combination of multiple cells that produces an electrical current. Secondary batteries, or rechargeable batteries can be run in both the forward and reverse directions, allowing many cycles to be completed over the lifetime of the battery. Batteries function during discharge through the flow of electrons from the anode to the cathode though an electrical circuit. In order to complete the circuit an electrolyte is required between the anode and the cathode, which allows the transport of ions to balance the net charge transfer of the electrons in the circuit. If electrons flow quickly through the electrolyte, the battery will not produce a useful current. The electrolyte must be chosen that inhibits electron flow and that is stable in the electrochemical window between the two electrodes. Li-based batteries widely believed to represent the future of battery technology due to lithium's high reduction potential, and low density.

In general, a thin film battery has all of the components of a traditional battery, an anode, cathode and electrolyte, and when a solid electrolyte is used, such as lithium phosphorous oxy-nitride ("LiPON"), the resulting battery is a solid-state device. Therefore, thin film batteries can be easily deposited directly onto a circuit board for easy incorporation with the electronics that it powers. Also the solid-state nature of the battery removes the liquid and its associated hazards and packaging requirements (usually flammable and prone to leaking). Fabrication of thin film batteries incorporates a substrate to provide the support structure, which the thin films can be deposited onto. The mass of the substrate has a significant impact on the energy density of the final battery, as the thin films have very little mass and provide high energy density per mass, but the substrate does not contribute to the energy content of the battery, thus significantly decreasing the energy density of real thin film batteries from the theoretical predictions. A systems engineering approach can be utilized, where there are number of materials that have been developed that have the appropriate properties, but strategies are needed which not only determine which material is to be used, but the associated processing costs to achieve the desired quality film can also be designed to develop a functional, cost-effective product which can be brought to market. Successfully engineered thin film batteries are anticipated to have many commercial applications including RF ID tags, sensors, smart cards, medical devices, and extreme temperature batteries. They may also be scaled to enable uses in the electronics and electric vehicle markets.

The electrolyte's job in a Li-based battery is to provide transport of the $Li^+$ ions (i.e. the transport number of $Li^+$ ions is one), while providing a high resistance to electrons enabling the selective and reversible transport of species. The ionic conductivity is a measure of the ability of the material to transport ions through a given distance. Higher ionic conductivities are desired to allow increase in the charging and discharge speed. The thickness of the films can also have an effect on the performance of the battery. Layers that are thinner will require less time for the ions to move through the film, thus electrolytes with lower ionic conductivities can be tolerated if they can prevent battery shorting even when the layers are thin (<approximately 2 µm). These characteristics have led to the development of solid-state electrolytes that are well suited to thin film battery applications.

LiPON is an important electrolyte material. LiPON has been found to be well suited for solid state electrolyte applications for thin film batteries in that they i) had high Li ion conductivity and ii) are stable in the presence of Li electrodes. LiPON chemistry is based on a lithium phosphorus oxide glass to which the addition of nitrogen leads to the substitution of nitrogen atoms for oxygen to effectively expand the average Li—O bond length though either a linkage or structural distortion with the N and Li. This nitridation of lithium glass lowers the activation energy of the Li ion transport from approximately 0.74 eV to approximately 0.57 eV, and therefore increases the mobility of the Li in the glassy film. The nitrogen incorporation into the Li glass structures also enhances the chemical and thermal stability of the glass, thereby increasing the stability of the structure to the presence of Li metal. There are a number of different electrolytes that have been developed to enable rechargeable Li based batteries, but only a few materials are stable with a Li electrode. Such compatibility can be important as Li is a desirable electrode in rechargeable battery applications due to the low mass and high energy density of the metal, leading to the ability to store a large amount of energy in a light weight electrode. The low stability of Li in ambient conditions as well as in contact with aqueous solutions also limits the choice of electrolytes that can be used with Li electrodes. In addition to the initial instability of lithium films in contact with oxygen, dendrites are also observed to grow on Li electrodes in contact with organic solutions and polymer film electrolytes. The dendrites can short out the batteries after significant growth, and can cause thermal run-away leading to the possibility of explosion. As a result, the use of solid state electrolyte layers that are stable in contact with Li, are also of interest for Lithium-Air batteries in which it is typically desirable to use organic liquid electrolytes that are not stable in contact with Li anodes.

A LiPON electrolyte layer is desired to be thin and pin-hole free leading to the use of physical vapor deposition techniques which are effective at creating thin, high quality layers with atomistic deposition. One such approach is radio frequency ("RF") sputtering in which a $LiPO_4$ target is sputtered in a nitrogen containing plasma environment to enable significant nitrogen doping of the depositing phosphate glass. The films generated with this technique display an ionic conductivity as high as approximately $2(\pm 1) \times 10^{-6}$ S/cm. However, the deposition rate of LiPON layers is slow with RF sputtering, typically just 1-2 nm/min. Other technologies such as pulsed laser deposition ("PLD"), ion-beam assisted deposition ("IBAD"), plasma enhanced chemical vapor deposition ("PECVD"), and electron-beam physical vapor deposition ("EB-PVD") can be utilized to deposit LiPON films. However, difficulties can be encountered in production scale operations for both the PLD and IBAD. The microstructure of LiPON PLD coatings are also quite rough which can lead to shorting and current fluctuations. IBAD coatings exhibit large tensile stress, which decrease the overall performance of the batteries, even when similar ionic conductivities are achieved. While the PECVD technique is able increase the deposition rate, it is only by a factor of approximately 4 over sputtering—thus, the deposition rates are still low. The ionic conductivities of EB-PVD LiPON films can be lower than ionic conductivities (presumably due to the lack of plasma induced $N_2$ incorporation) achieved by other techniques, and only modest increases in the deposition rate have been achieved. Such technical challenges have led to a high cost of manufacture for the LiPON layers, and has significantly increased the cost of bringing these products to the market and the per part manufacturing cost. This high processing cost has also limited the use of LiPON in other types of Li based batteries.

Directed Vapor Deposition ("DVD") is an approach for vapor depositing high quality coatings, see, e.g., FIG. 1. The approach provides a basis for a flexible, high quality coating process capable of atomistically depositing dense, compositionally controlled coatings onto line-of-sight and non-line-of-sight regions of components. Unlike other physical vapor deposition ("PVD") approaches, DVD is specifically designed to enable the transport of vapor atoms from a source to a substrate to be highly controlled. To achieve this, DVD technology utilizes a trans-sonic gas jet to direct and transport a thermally evaporated vapor cloud onto a component. Typical operating pressures are in the approximately 1 to approximately 50 Pa range requiring that only fast and inexpensive mechanical pumping be used and that chamber pump down times are short. In this processing regime, collisions between the vapor atoms and the gas jet create a mechanism for controlling vapor transport. This enables several unique capabilities:

1) High Rate Deposition: Vapor phase collisions between the gas jet and vapor atoms allow the flux to be "directed" onto a substrate. Since a high fraction of the evaporated flux impacts the substrate (i.e. the materials utilization efficiency is increased) instead of undesired locations (such as the walls of the vacuum chamber) a very high deposition rate (>approximately 10 μm min$^{-1}$) can be obtained, allowing for fast coating times.
2) Non-Line-of-Sight (NLOS) Deposition: The gas jet can be used to carry vapor atoms into internal regions of components, or "behind corners" and then scatter them onto surfaces to result in significant NLOS deposition. This capability enables depositions on complex geometries such as are being considered for 3-D thin film batteries.
3) Controlled Intermixing of Multiple Sources: The use of high frequency e-beam scanning (approximately 100 kHz) allows multiple source rods to be simultaneously evaporated. By using binary collisions with the gas jet atoms, the vapor fluxes are intermixed allowing the composition of the vapor flux (and thus, the coating) to be uniquely controlled. Thus, new alloy compositions can be deposited through the intermixing of the vapor of multiple closely spaced sources to deposit uniform compositions onto substrates.

In addition, hollow cathode plasma activation can be used to improve the density, to lower the deposition temperature, and to limit the number of defects in the deposited layers. This is done by ionizing vapor and gas jet atoms and attracting them to the substrate with an applied bias. Therefore, the ability of the DVD approach to combine high rate deposition, compositional control (included layered and compositionally graded structures), non line-of-sight deposition and deposition temperature control that is valuable for the deposition of LiPON electrolyte films for battery applications.

FIG. 1 is a block diagram of an exemplary embodiment of a system 1000, which schematically illustrates an exemplary plasma-assisted DVD process. System 1000 comprises a chamber 1050, an electron beam source 1100 (e.g., an electron beam source utilizing jumping beam technology with a scanning rate of approximately 100 kHz), a hollow cathode plasma subsystem 1200, a mixed vapor 1300, an anode 1400, a cathode 1500, an e-beam sensor 1600, a four rod crucible 1700, an evaporant material A 1800, an evaporant material B 1820, and material feeders 1900.

Figure 2:
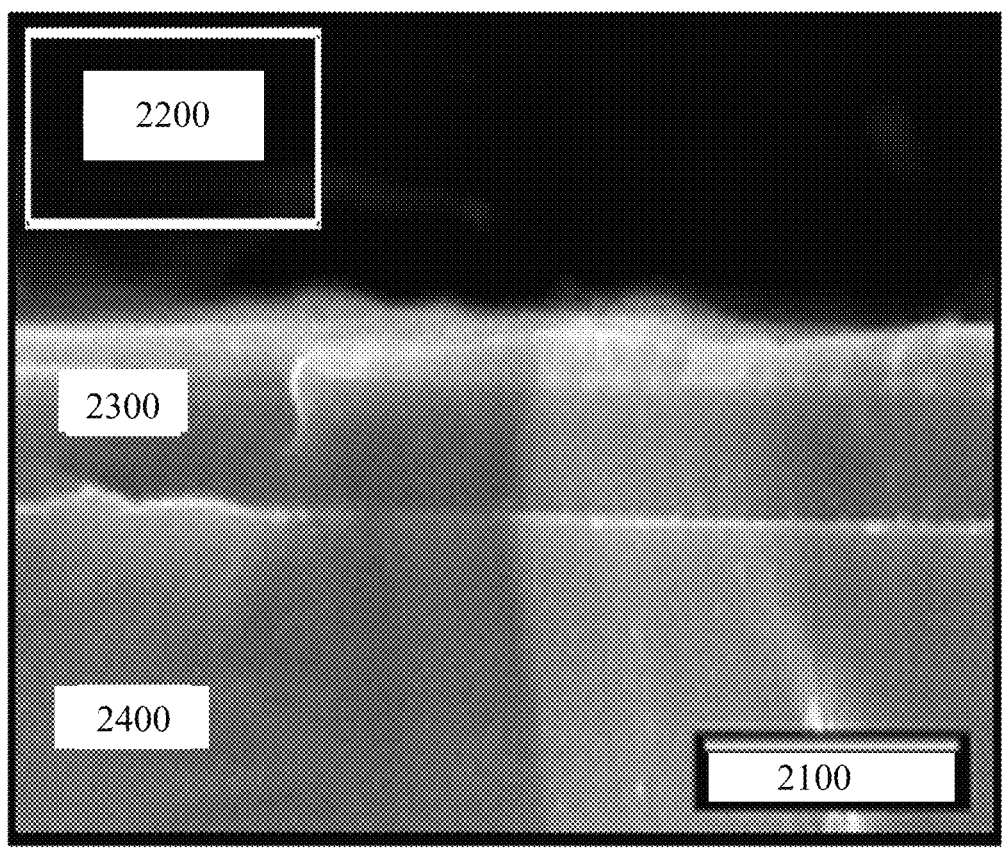
FIG. 2 is a photograph of an exemplary embodiment of a system 2000.

FIG. 2 is a photograph of an exemplary embodiment of a system 2000, which illustrates a LiPON coating deposited by an exemplary DVD process. System 2000 shows a photograph on a one micron scale 2100, a label 2200 ("90 A" on this photograph), a LiPON layer 2300, and a silicon substrate 2400.

Figure 3:
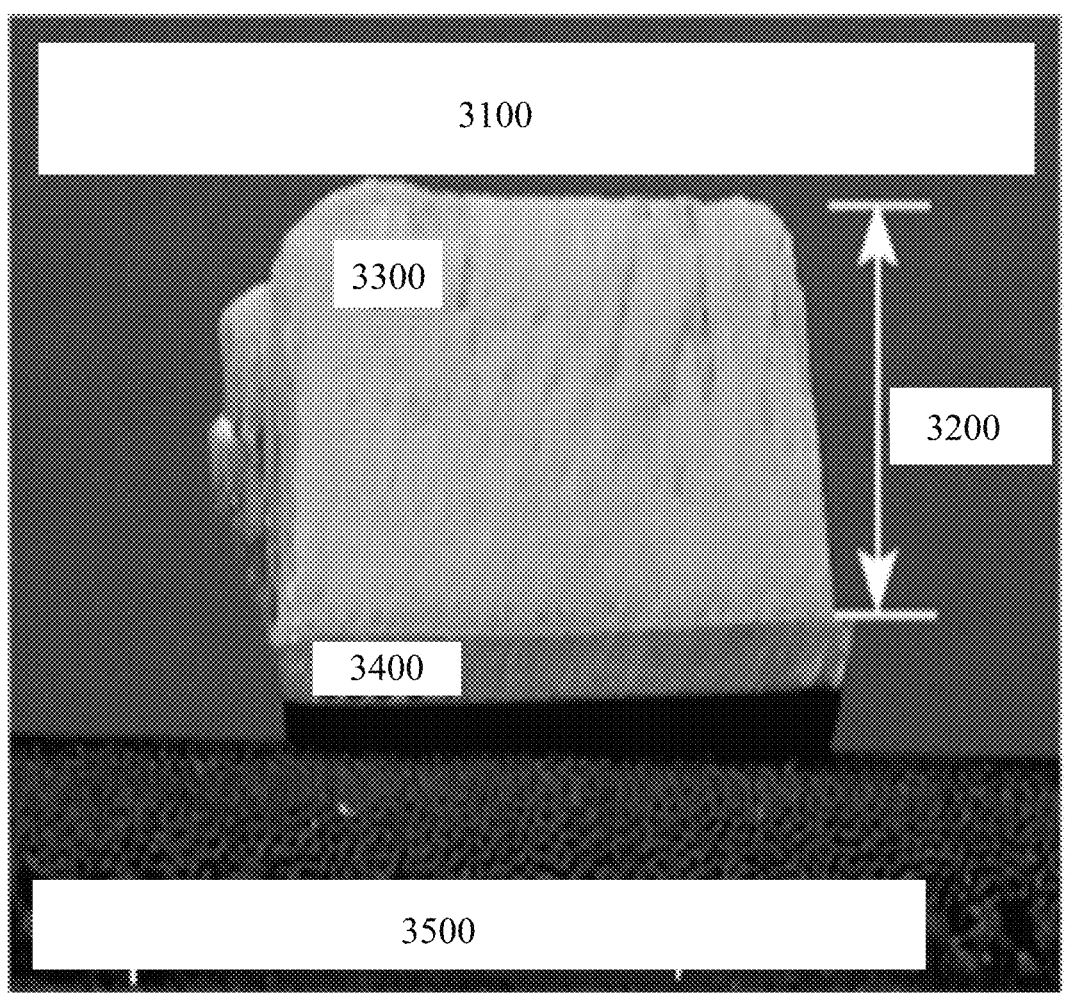
FIG. 3 is a photograph of an exemplary embodiment of a system 3000.

FIG. 3 is a photograph of an exemplary embodiment of a system 3000, which illustrates high deposition rates that have been achieved. A label indicative of a high rate deposition of Yttria-stabilized zirconia ("YSZ") 3100 is illustrated. System 3000 has an object dimension 3200 of approximately 6.5 millimeters. System 3000 illustrates an object 3300 comprising YSZ deposited on a 304 stainless steel substrate 3400. System 3000 illustrates an object created via a deposition rate of approximately 87 microns/minute of deposited material.

In LiPON electrolyte films, the incorporation of nitrogen can increase the ionic conductivity of the film. The addition of nitrogen to lithium phosphorus oxide glasses leads to a substitution of nitrogen for oxygen, which expands the average Li—O bond length. This substitution is also found to lower the activation energy of the Li ion, and therefore increases the mobility of the Li in the glassy film. The incorporation of the nitrogen Li glass structures also enhances the chemical and thermal stability of the glass, thereby increasing the stability of the structure to the presence of Li metal.

When using the DVD approach for LiPON deposition, nitrogen incorporation is enabled through the use of a hollow cathode plasma activation approach, which breaks the triple bond of the $N_2$ molecules prior to incorporation into the growing film. The particular hollow cathode arc plasma technology used in DVD is able to ionize a large percentage of all gas and vapor species in the mixed stream flowing towards the coating surface. This ionization percentage in a low vacuum environment is unique to the DVD system. A maximum ionic conductivity can be achieved with approximately 10% $N_2$ in the carrier gas. Increased nitrogen content can also be achieved when higher plasma currents are employed. However such increases also reduce the Li level. This work was performed on the apparatus shown in FIG. 1 in which a nozzle/crucible apparatus similar to that shown in FIG. 4 was utilized. This apparatus created a $Li_3PO_4$ vapor flux and passed it through a plasma created from a low voltage electron beam, which moved from a cathode to an anode with a constant polarity. When high plasma currents were employed, some Li atoms, being very light were, directed away from the substrate and the Li content of the film was lower than desired (i.e. Li leaching).

Figure 4:
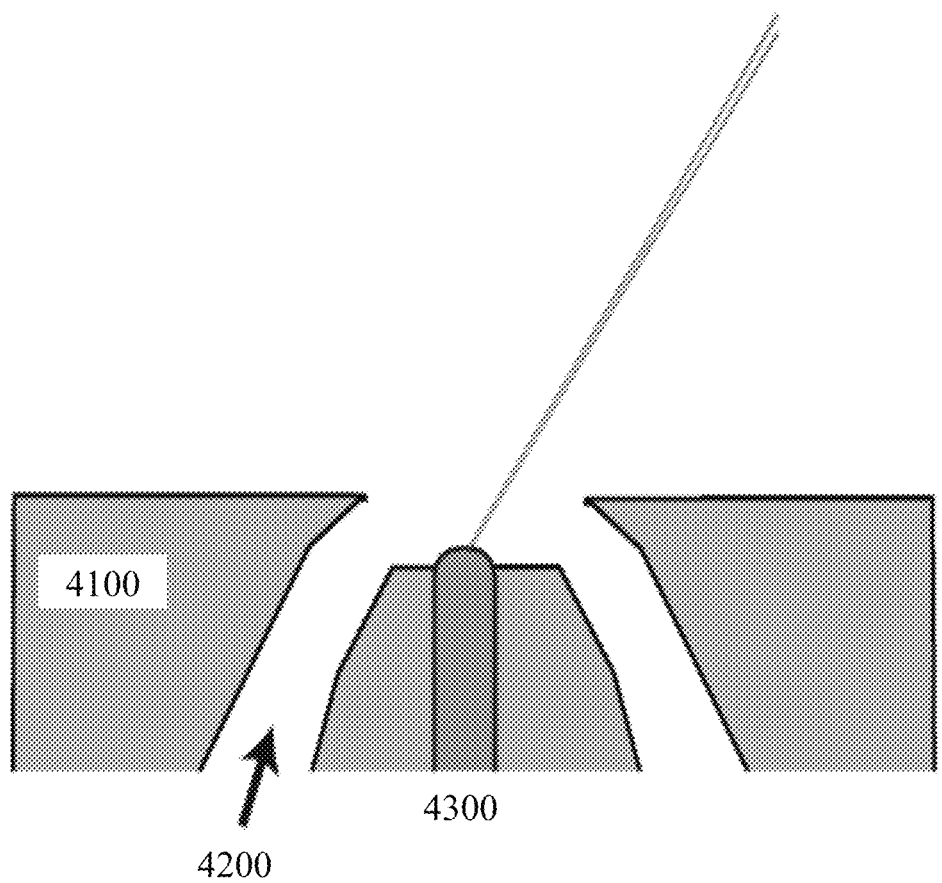
FIG. 4 is a block diagram of an exemplary embodiment of a system 4000.

FIG. 4 is a block diagram of an exemplary embodiment of a system 4000, which comprises a nozzle 4100, a carrier gas 4200 (which can comprise $N_2$ and/or Ar), and an $Li_3PO_4$ source 4300. System 4000 can be utilized a portion of a DVD LiPON deposition system that comprises a crucible/nozzle device.

Nevertheless, this apparatus demonstrated that the directed vapor deposition (DVD) can be used to achieve orders of magnitude improvement in deposition rate of solid LiPON electrolyte layers while simultaneously achieving ionic conductivity values similar to those achieved through RF sputtering. Certain exemplary embodiments provide a plasma assisted DVD technique to deposit LiPON films at high rate (>approximately 40×RF sputtering), with no through pores and reasonable ionic conductivities (approximately 0.25×RF sputtering). However, improved ionic conductivity values (up to those achieved by RF sputtering) can be demonstrated along with further enhanced deposition rates and high throughput scale-up approaches to drive the transition of this technology into next generation Li-based battery systems. Using a modified apparatus, (see, e.g., pending U.S. patent application Ser. No. 14/863,169, which is incorporated by reference herein in its entirety) the Li leaching issue can be mitigated such that higher Li contents can be obtained when using high plasma currents. This, along with the use of the higher nitrogen contents taught in this disclosure resulted in enhanced deposition rate (>approximately 100×RF sputtering) and similar ionic conductivities to the RF sputtering baseline (approximately 1×RF sputtering).

One issue that has limited the ability to reach even higher deposition rate using this technique is that at the chamber pressures utilized in the DVD process the vapor pressure of the $Li_3PO_4$ source utilized is such that boiling can be observed in the liquid melt pool. The bubbles that form in the melt pool result in "spits" of solid material that is ejected from the liquid and results in defects in the resulting LiPON coatings. These spits can be avoided to have a functional electrolyte and allow higher evaporation rates from the melt pool.

In certain exemplary embodiments, modifications can enable:

Enhanced ionic conductivity;
Reduced defect contents in the deposited films; and/or
Enhanced deposition rates.
Note: The discussion below used $Li_3PO_4$ as an example material, however, the techniques described are not limited to the evaporation of any certain material.

Enhanced Ionic Conductivity:

An aspect for obtaining high ionic conductivities in LiPON glasses is the composition of the film. A DVD technique can be used to form LiPON films used $N_2$ gas as a dopant in an inert gas jet (Ar, He). The conditions used, however, can result in $N_2$ deficient films that have Li-ion conductivities lower than those observed using sputtering based deposition techniques. A significant portion of the carrier gas can be an inert carrier gas to enable the use of the high chamber pressures of the DVD technique. Certain exemplary embodiments utilize a higher dopant concentrations, which can be beneficial for the case of an $N_2$/inert gas carrier gas combination and the inert gas can also be completely replaced by $N_2$. This is not obvious to those skilled in the art as it was previously generally believed that a significant portion of the carrier gas must be inert to counteract the detrimental effects of moisture and other chamber impurities at the chamber pressures utilized for such techniques.

The use of enhanced $N_2$ contents in the DVD carrier gas has been determined to not only increase the nitrogen content in the LiPON film but also result in films with relatively high Li-ion conductivities. Value of ionic conductivity greater than $1 \times 10^{-6}$ can be achieved using enhanced $N_2$ contents in the DVD carrier gas.

Reduced Defect Content:

One of the major challenges with LiPON deposition is the creation of films having very low defect contents or pinhole contents. Pinholes can result in a short circuit for a battery cell and therefore should be avoided.

When using $Li_3PO_4$ as a source material for LiPON creation, the vapor pressure of the species evaporated from the $Li_3PO_4$ source near or slightly above its melting point is similar to that of the chamber pressures typically utilized in the DVD process (approximately 5 to approximately 20 Pa). The result is that source boiling is observed if the temperature of the liquid melt pool is increased moderately above its melting point. This can limit the maximum temperature of the melt pool and thus the maximum evaporation rate achievable without forming defects in the melt pool.

To avoid this, pressures near the melt pool can exceed a vapor pressure of the $Li_3PO_4$ liquid during evaporation. It was not obvious how to achieve this based on certain prior art because increases in pressures in the deposition chamber can result in the formation of "clusters" in the vapor phase (clusters are agglomerates of vapor atoms and/or molecules). Clusters can alter the microstructure of the resulting film and can be detrimental to properties of the film.

Certain exemplary embodiments provide process conditions that can be utilized to expand the maximum temperature the $Li_3PO_4$ melt pool can be exposed to prior to boiling and an apparatus to achieve such conditions. Certain exemplary embodiments allow suitable evaporation, large evaporation areas, and in a manner that limits the formation of clusters.

An exemplary apparatus is shown in FIG. 1. Using this configuration, the range of chamber pressures can be approximately $7.5 \times 10^{-3}$ Torr to approximately 0.75 Torr and pressure ratio (as defined by the upstream pressure/chamber pressure) as greater than approximately 2. To increase the melt pool temperature prior to boiling, the upstream pressure can be increased as much as practicable. In addition, a low chamber pressure is desired to limit cluster formation. This creates a situation in which the vapor atoms are exposed to the high pressures upstream of the nozzle choke point for a short time, while spending a majority of the vapor transport time in the lower pressure conditions in the chamber. This means that a high upstream pressure and a high-pressure ratio are desired. This can be difficult to achieve using certain systems. The nozzle opening area can be large enough to allow the e-beam to apply thermal energy to the source. Larger source sizes can be utilized to increase the evaporation area (and thus the evaporation rate), however, this requires larger nozzle opening areas. Thus variations to the apparatus can be utilized to achieve the unique processing conditions used in certain exemplary embodiments.

Figure 5A:
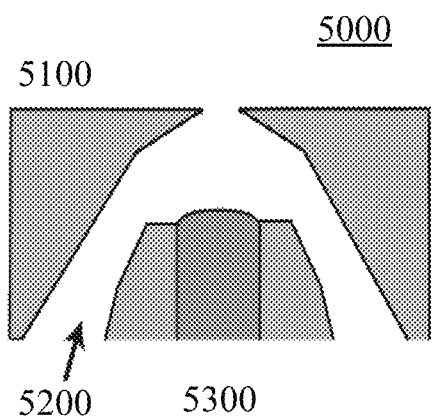
FIG. 5A is a block diagram of an exemplary embodiment of a system 5000.
Figure 5B:
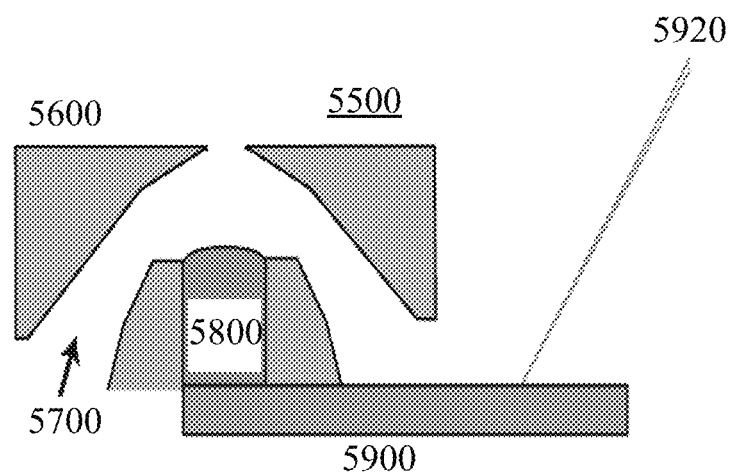
FIG. 5B is a block diagram of an exemplary embodiment of a system 5500.
Figure 6A:
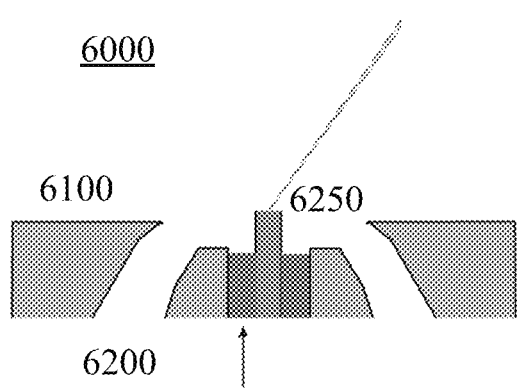
FIG. 6A is a block diagram of an exemplary embodiment of a system 6000.
Figure 6B:
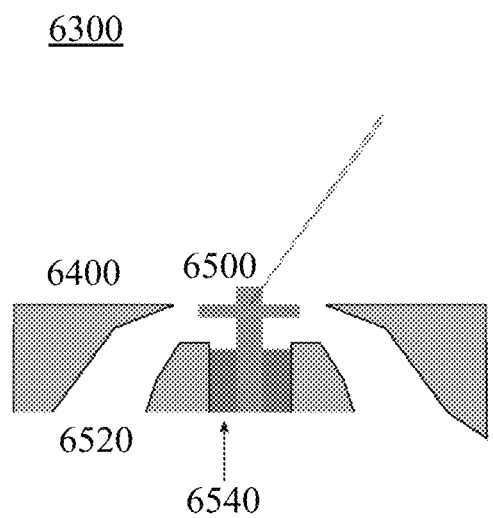
FIG. 6B is a block diagram of an exemplary embodiment of a system 6300.
Figure 6C:
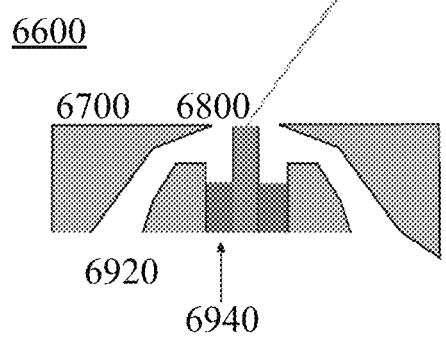
FIG. 6C is a block diagram of an exemplary embodiment of a system 6600.

In FIGS. 5A, 5B, 6A, 6B, 6C, 7, and 8 modifications to the coating apparatus are given to enable both higher-pressure ratios at a given pumping rate and increased evaporation area. In these cases indirect heating of the $Li_3PO_4$ source can be utilized. This heating could be resistive heating and/or direct e-beam heating of a material in contact with the $Li_3PO_4$. In addition, it could also include e-beam or resistive or other form of thermal heating of a thermally conductive material protruding from the $Li_3PO_4$ source and extending through the nozzle choke point as shown in FIGS. 6A, 6B, and 6C. The geometry of the protruding material may also include features that limit the line-of-sight between the $Li_3PO_4$ melt pool and the substrate. This is to prevent the transport of a defect initiated in the melt pool (if such form) from reaching the substrate. Features to limit a line-of-sight path for any defect could also include a plate with multiple holes, non-linear holes or a porous media (i.e. a foam) that would allow an atomistic or molecular vapor to pass through but not a larger particle, FIGS. 7 and 8. These designs can be advantageous for conditions where the melt pool is boiling in addition to higher pressure conditions that suppress boiling.

FIG. 5A is a block diagram of an exemplary embodiment of a system 5000, which comprises a nozzle 5100, a carrier gas 5200 (which can comprise $N_2$ and/or Ar), and a $Li_3PO_4$ source 5300.

FIG. 5B is a block diagram of an exemplary embodiment of a system 5500, which comprises a nozzle 5600, a carrier gas 5700 (which can comprise $N_2$ and/or Ar), and a $Li_3PO_4$ source 5800, a thermally conductive material 5900, and an e-beam 5920.

Certain exemplary embodiments utilizing system 5000 and/or system 5500 can comprise a crucible/nozzle apparatus having indirect heating and/or a larger evaporation source to enable large area evaporation at very high pressure ratios (greater than 5) and at high upstream pressures.

FIG. 6A is a block diagram of an exemplary embodiment of a system 6000, which comprises a nozzle 6100, a carrier gas 6200 (which can comprise $N_2$ and/or Ar), and a $Li_3PO_4$ source 6280, and a rod 6250 (e.g., a tantalum rod).

FIG. 6B is a block diagram of an exemplary embodiment of a system 6300, which comprises a nozzle 6400, a carrier gas 6520 (which can comprise $N_2$ and/or Ar), and a $Li_3PO_4$ source 6540, and a rod 6500 (e.g., a tantalum rod).

FIG. 6C is a block diagram of an exemplary embodiment of a system 6600, which comprises a nozzle 6700 (e.g., a tantalum nozzle), a carrier gas 6920 (which can comprise $N_2$ and/or Ar), and a $Li_3PO_4$ source 6940, and a rod 6800 (e.g., a tantalum rod).

Certain exemplary embodiments utilizing system 6000, system 6300, and/or system 6600 can comprise indirect heating of a thermally conducting rod or other shape to enable large area evaporation at very high pressure ratios (greater than approximately 5) and at high upstream pressures.

Figure 7:
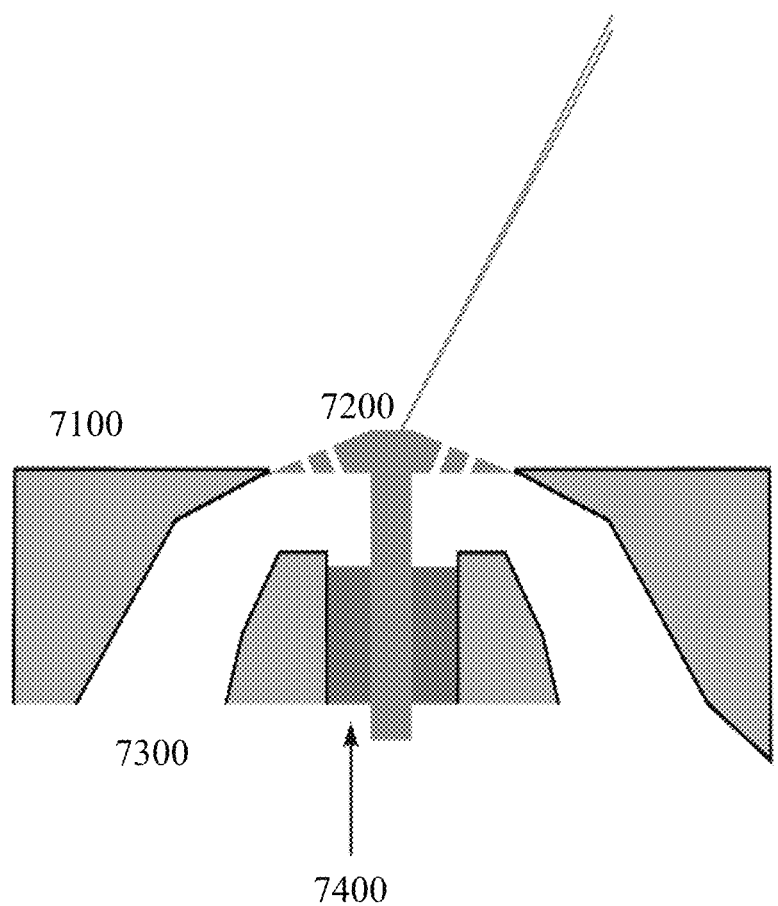
FIG. 7 is a block diagram of an exemplary embodiment of a system 7000.

FIG. 7 is a block diagram of an exemplary embodiment of a system 7000, which comprises a nozzle 7100 (e.g., a tantalum nozzle), a carrier gas 7300 (which can comprise $N_2$ and/or Ar), and a $Li_3PO_4$ source 7400, and a rod 7200 (e.g., a tantalum rod).

System 7000 provides for indirect heating of a thermally conducting shape having periodic holes or non-linear openings to enable large area evaporation at very high pressure ratios (greater than approximately 5) and at high upstream pressures or to create a non-line-of-sight path between particles emanating from the $Li_3PO_4$ source and the substrate.

Figure 8:
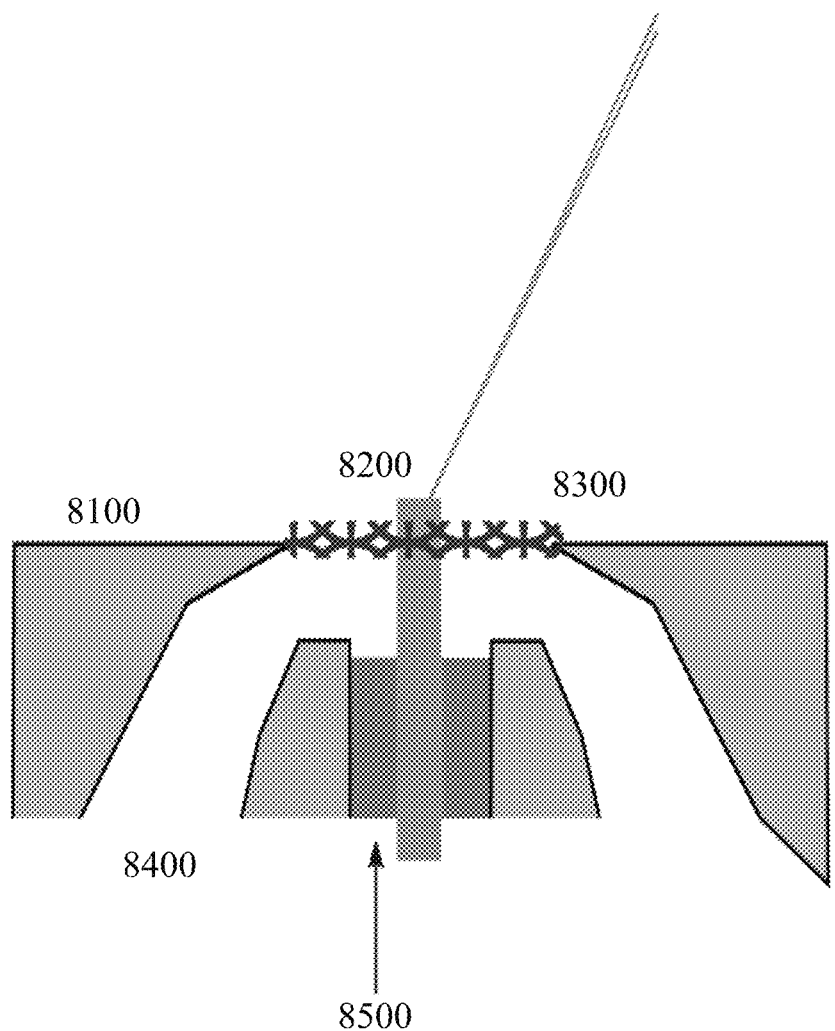
FIG. 8 is a block diagram of an exemplary embodiment of a system 8000.

FIG. 8 is a block diagram of an exemplary embodiment of a system 8000, which comprises a nozzle 8100 (e.g., a tantalum nozzle), a carrier gas 8400 (which can comprise $N_2$ and/or Ar), and a $Li_3PO_4$ source 8500, a rod 8200 (e.g., a tantalum rod), and foam 8300 (e.g., tantalum foam).

System 8000 provides for indirect heating of a thermally conducting shape with at least part having an open cell foam structure to enable large area evaporation at very high pressure ratios (greater than approximately 5) and at high upstream pressures or to create a non-line-of-sight path between particles emanating from the $Li_3PO_4$ source and the substrate.

Figure 9:
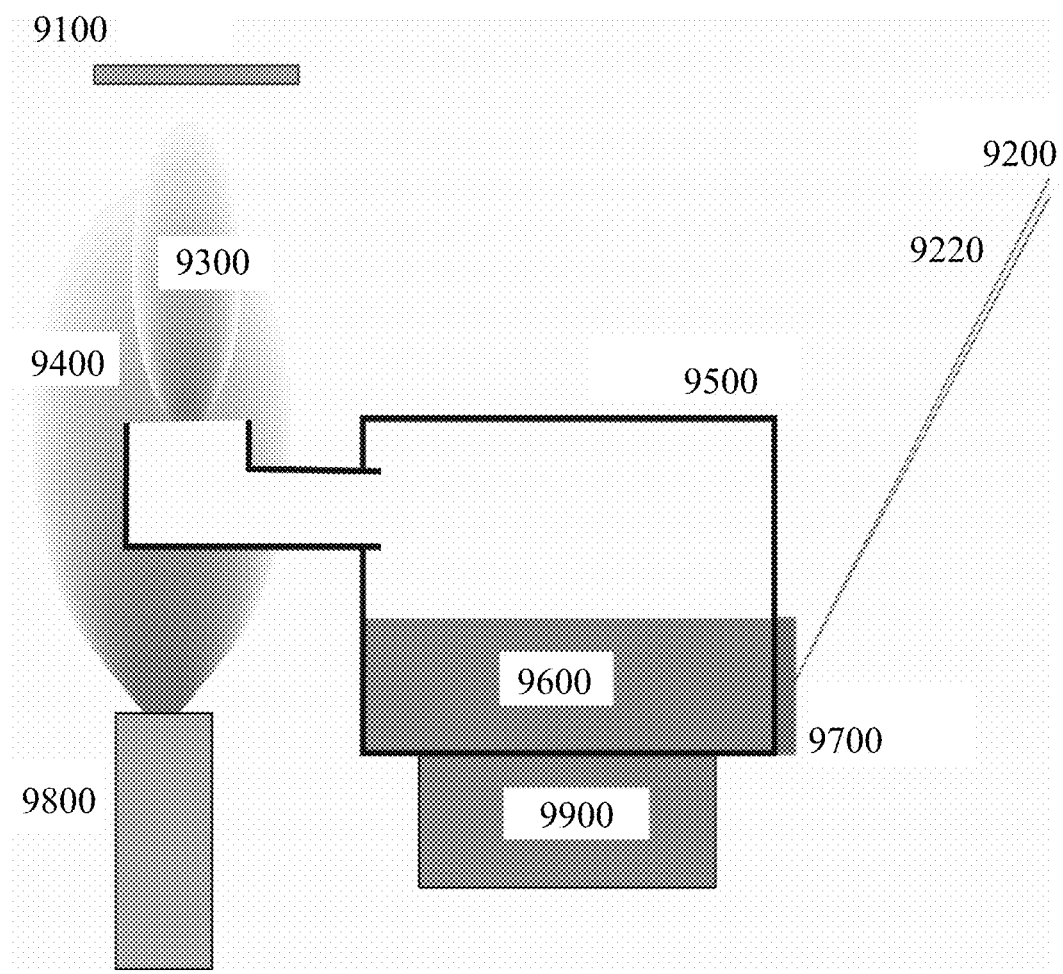
FIG. 9 is a block diagram of an exemplary embodiment of a system 9000.

FIG. 9 is a block diagram of an exemplary embodiment of a system 9000, which comprises a substrate 9100, an electron beam source 9200 constructed to emit an electron beam 9220, vapor cloud 9300, $N_2$ and/or Ar gas 9400, a hot walled kettle 9500, a melt pool 9600, a hot strike plate 9700, a gas jet nozzle 9800, and a $Li_3PO_4$ source 9900.

It is also possible to have the carrier gas outside of the evaporation chamber as given in FIG. 9. This approach can use resistive heating in place of indirect e-beam heating. System 9000 provides for indirect heating of a thermally conducting shape to enable large area evaporation within an enclosure to block particle emanating from a vapor source.

Certain exemplary embodiments provide a system comprising:

- a directed vapor deposition chamber (see, e.g., chamber 1050 of FIG. 1);
- material feeders (see, e.g., chamber 1950 of FIG. 1) constructed to transport a LiPON source to hot walled kettle 9500;
- hot walled kettle 9500, which is constructed to generate a vapor cloud comprising LiPON, hot walled kettle 9500 is constructed to cause a change of direction of the vapor cloud and thereby prevent particles emanating from a boiling liquid in the hot walled kettle from depositing on a substrate;
- nozzle 9800, which injects a carrier gas into the directed vapor deposition chamber (see, e.g., chamber 1050 of FIG. 1) such that the carrier gas intermingles with the vapor cloud;
- a hollow cathode plasma subsystem (see, e.g., cathode plasma subsystem 1200 of FIG. 1) that ionizes at least a portion of the vapor cloud prior to the vapor cloud depositing LiPON on the substrate;
- electron beam source 9200 constructed to: provide electron beam 9220 to generate vapor cloud 9300 and/or provide energy to generate vapor cloud 9300, wherein electron beam 9220 imparts energy to a thermally conductive material (see, e.g., thermally conductive material 5900 of FIG. 5B) in contact with the LiPON source (see, e.g., LiPON source 5800 of FIG. 5B);
- an anode (see, e.g., anode 1400 of FIG. 1) that directs electron beam 9220 to a crucible (see, e.g., crucible 1700 of FIG. 1);
- a pulsed plasma (see, e.g., pulsed plasma 13420 of FIG. 13) that promotes deposition in non-line-of-sight regions;
- secondary gas nozzles (see, e.g., secondary gas nozzles 13700 of FIG. 13) that direct vapor transport from a vapor source (e.g., $Li_3PO_4$ source 9900) to substrate 9100 located in non-line-of-sight regions relative to the vapor source (e.g., $Li_3PO_4$ source 9900);
- a tapered $Li_3PO_4$ source (see, e.g., tapered $Li_3PO_4$ source 16100 of FIG. 16);
- a thermally conducting rod (see, e.g., rod 6250 of FIG. 6A) via which the LiPON source emits the vapor cloud; and/or
- a particle-separating cyclone (see, e.g., cyclone 10900 of FIG. 10) that separates particles from the vapor cloud.

In addition, another method to prevent particles emanating from a boiling liquid from depositing onto a substrate is to separate the particles from the vapor flux prior to the vapors deposition onto a substrate. This can be accomplished through the system shown in FIG. 10 where a carrier gas is used to direct a vapor flux into a particle-separating cyclone. Particles in the flux hit the walls of the cyclone and fall to the bottom of the cyclone or deposit on the walls. The vapor flux is carried through the cyclone and exits the tops without the presence of any particles. The cyclone walls may optionally be heated to prevent the deposition of any of the $Li_3PO_4$ flux on the inner walls of the cyclone. The temperature of the cyclone walls should be high enough that the sticking coefficient of the $Li_3PO_4$ is relatively low.

Figure 10:
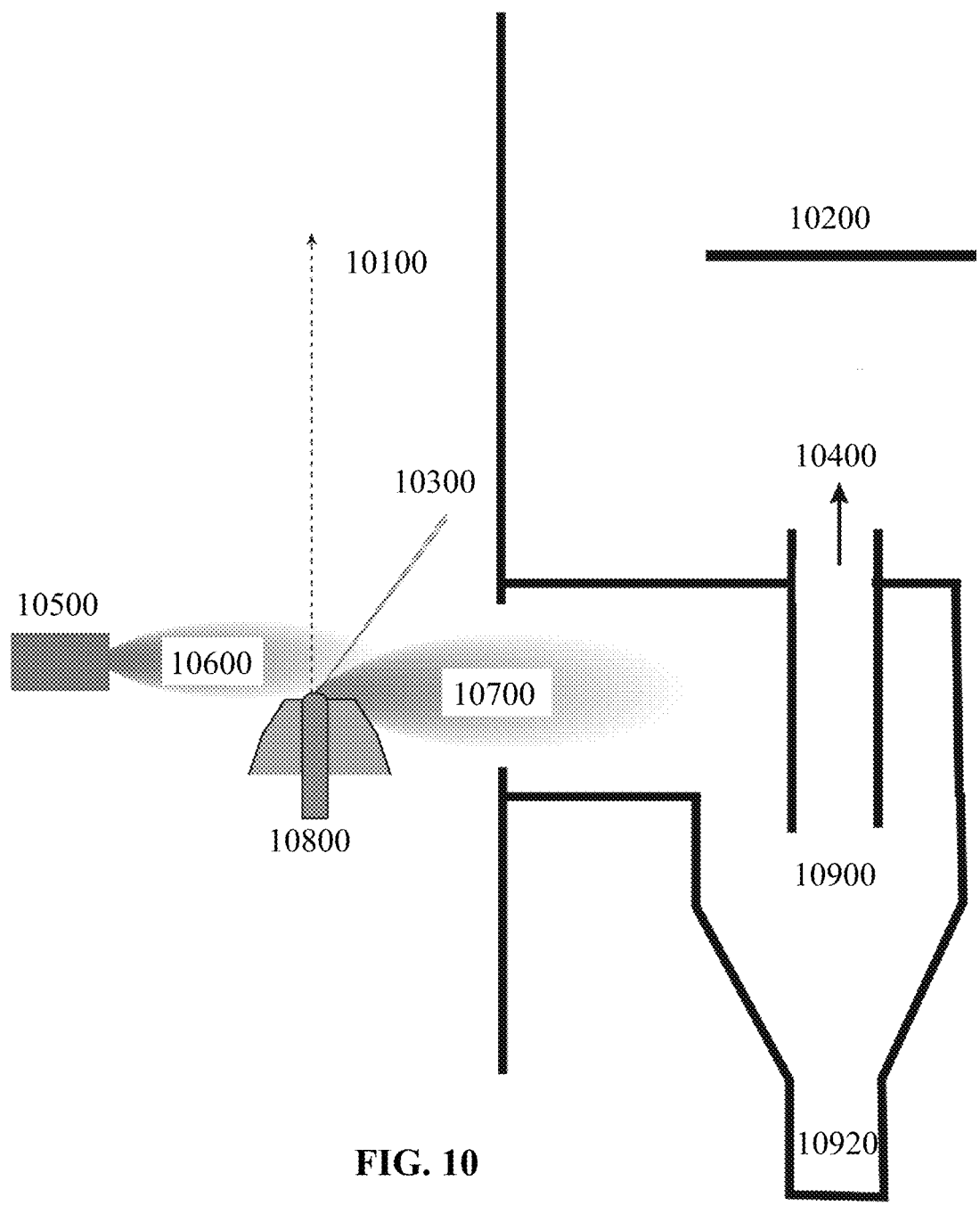
FIG. 10 is a block diagram of an exemplary embodiment of a system 10000.

FIG. 10 is a block diagram of an exemplary embodiment of a system 10000, which comprises a heavy particle trajectory 10100, a substrate 10200, an e-beam 10300, a vapor flux 10400, a gas jet nozzle 10500, $N_2$ and/or Ar gas 10600, $Li_3PO_4$ flux 10700, $Li_3PO_4$ source 10800, a hot walled cyclone separator 10900, and particles 10920. System 10000 uses hot walled cyclone separator 10900 to remove particles 10920 from particle laden $Li_3PO_4$ flux 10700.

Additionally particles in a particle laden vapor flux can be removed by applying energy to the particles such that they are evaporated (solid to vapor). This can be accomplished using the apparatus shown in FIG. 11.

Figure 11:
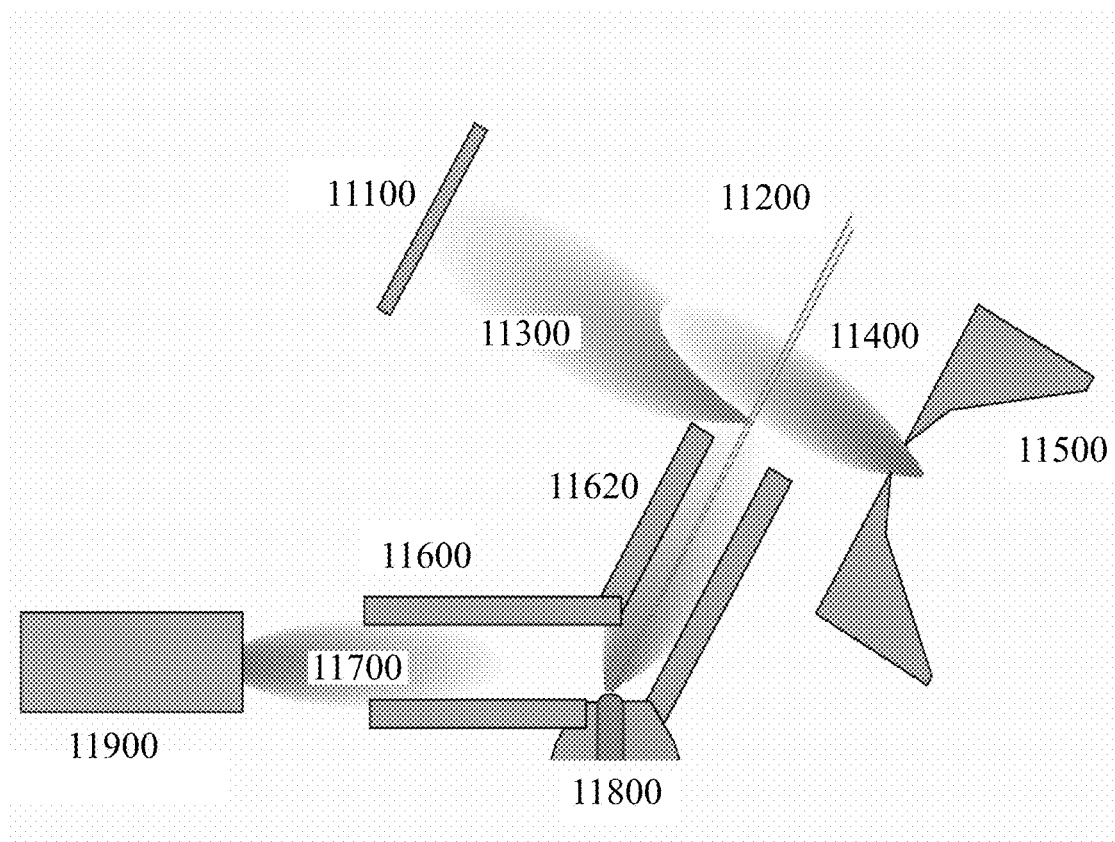
FIG. 11 is a block diagram of an exemplary embodiment of a system 11000.

FIG. 11 is a block diagram of an exemplary embodiment of a system 11000, which comprises a substrate 11100, an e-beam 11200, a vapor cloud 11300, $N_2$ and/or Ar gas 11400, a primary gas nozzle 11500, a crucible 11600, $N_2$ and/or Ar gas 11700, $Li_3PO_4$ source 11800, a secondary gas nozzle 11900. System 11000 uses an electron beam to vaporize particles in a particle laden vapor flux.

In system 11000 primary gas nozzle 11500 is constructed to direct a vapor cloud toward substrate 11100 and thereby cause LiPON deposition on substrate 11100. Secondary gas nozzle 11900 directed toward crucible 11600 comprising $Li_3PO_4$ (from $Li_3PO_4$ source 11800). Crucible 11600 is constructed to generate vapor cloud 11300 from the $Li_3PO_4$. Walls 11620 of crucible 11600 change a direction of carrier gas ($N_2$ and/or Ar gas 11400) from secondary gas nozzle 11900 and cause the carrier gas to be directed toward the vapor cloud, wherein the change in the direction of the carrier gas causes particles from crucible 11600 to not be deposited on substrate 11100.

In addition to elevating the pressure near the surface of the melt pool, the use of composite melt pools and compositionally modified melt pools can be utilized as a means to suppress boiling at a chosen chamber pressure. Composite melt pools can comprise a combination of liquid $Li_3PO_4$ and a non-reactive, non-melting openly porous material. The liquid can be infiltrated into the open, interconnected pores of the porous material. The porous material restricts either the nucleation and/or growth of bubbles or the movement of the bubble to the surface of the liquid. Finely sized pore openings are desired (sub micron) to limit the maximum bubble size. Keeping the upper level of the liquid lower than the porous material further prevents the transport of any defect formed from striking the substrate. Materials that can be utilized for combination with the liquid comprise particle beds, porous hot-pressed particles, foams, and aerogels, etc. Examples of materials that can be utilized comprise zirconia and tantalum.

Modification of the melt pool composition can also be used to reduce the vapor pressure of the $Li_3PO_4$ material. In this case, the additions to the $Li_3PO_4$ should have a lower vapor pressure than the $Li_3PO_4$ and also dissolve into the $Li_3PO_4$ melt upon heating. The additions should also not detrimentally alter the properties of the resulting LiPON film. One material that fits this profile is Si and/or $SiO_2$. A $Li_{3.6}Si0.6P0.4O_4$ material has been reported to have a higher ionic conductivity than LiPON and therefore a composition is this range is applicable.

Figure 12:
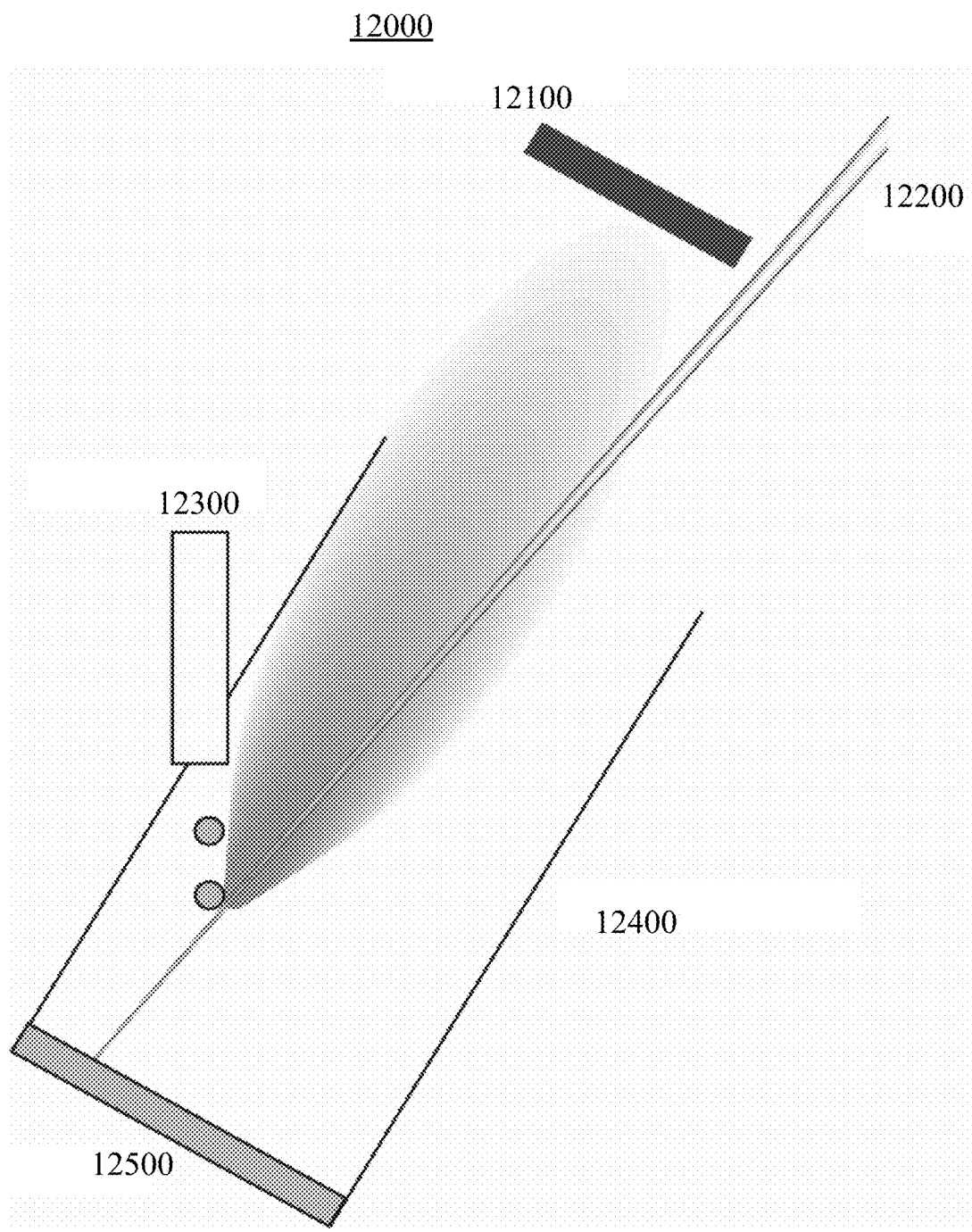
FIG. 12 is a block diagram of an exemplary embodiment of a system 12000.

Another approach to avoid melt pool boiling is to use sublimation approaches to directly transform solid $Li_3PO_4$ into a vapor. Thus, avoiding the formation of a liquid melt pool. In this case the $Li_3PO_4$ is fed into the chamber as a powder/particle and then passed through an electron beam flux. The electrons heat the powders until it is a vapor. Any particles that pass through the electron flux without completely vaporizing hit a plate heated by the electron beam. This plate has a temperature exceeding the vapor pressure of the particle so that the particle vaporizes. FIG. 12 illustrates such a system.

FIG. 12 is a block diagram of an exemplary embodiment of a system 12000, which comprises a substrate 12100, an e-beam 12200, a powder feeder 12300, a container 12400, and a hot plate 12500. System 12000 is an apparatus to vaporize particles injected into a deposition chamber using an electron beam and/or a hot plate to create a vapor flux.

Figure 13:
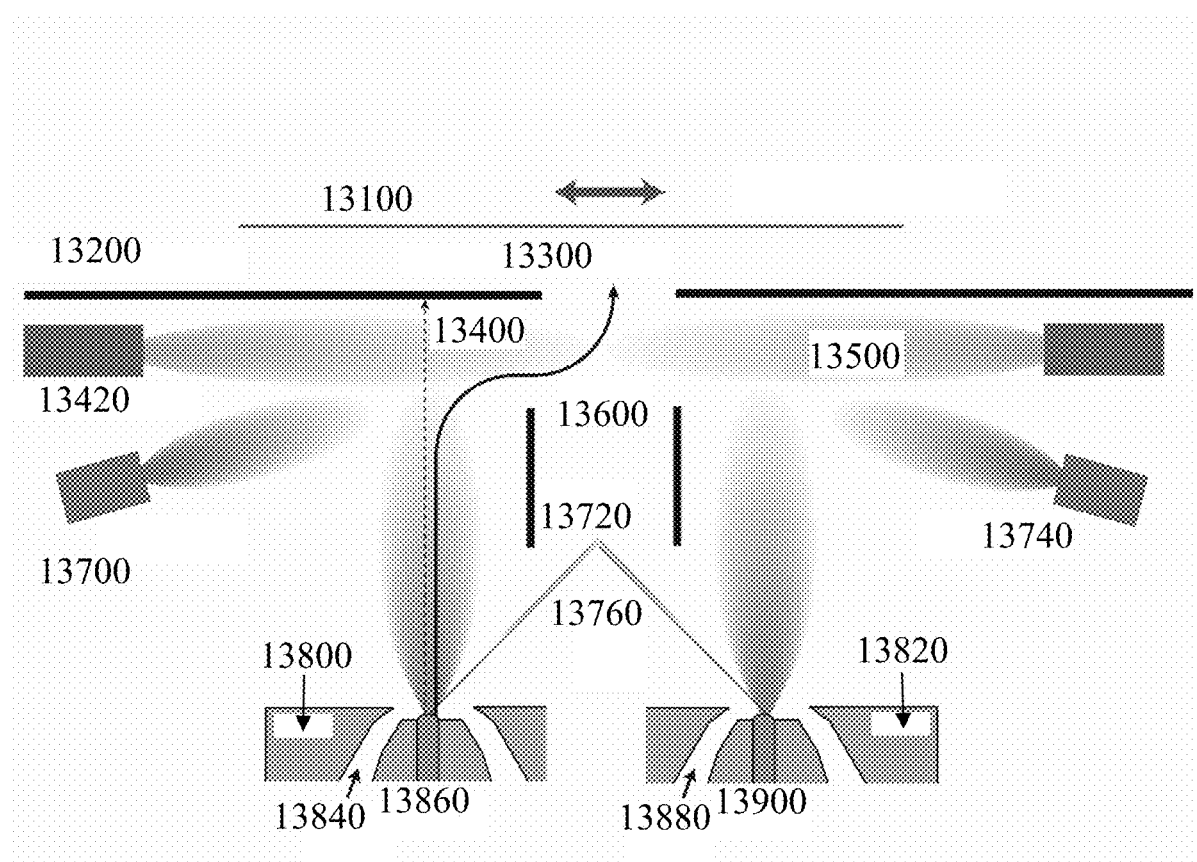
FIG. 13 is a block diagram of an exemplary embodiment of a system 13000.
Figure 14:
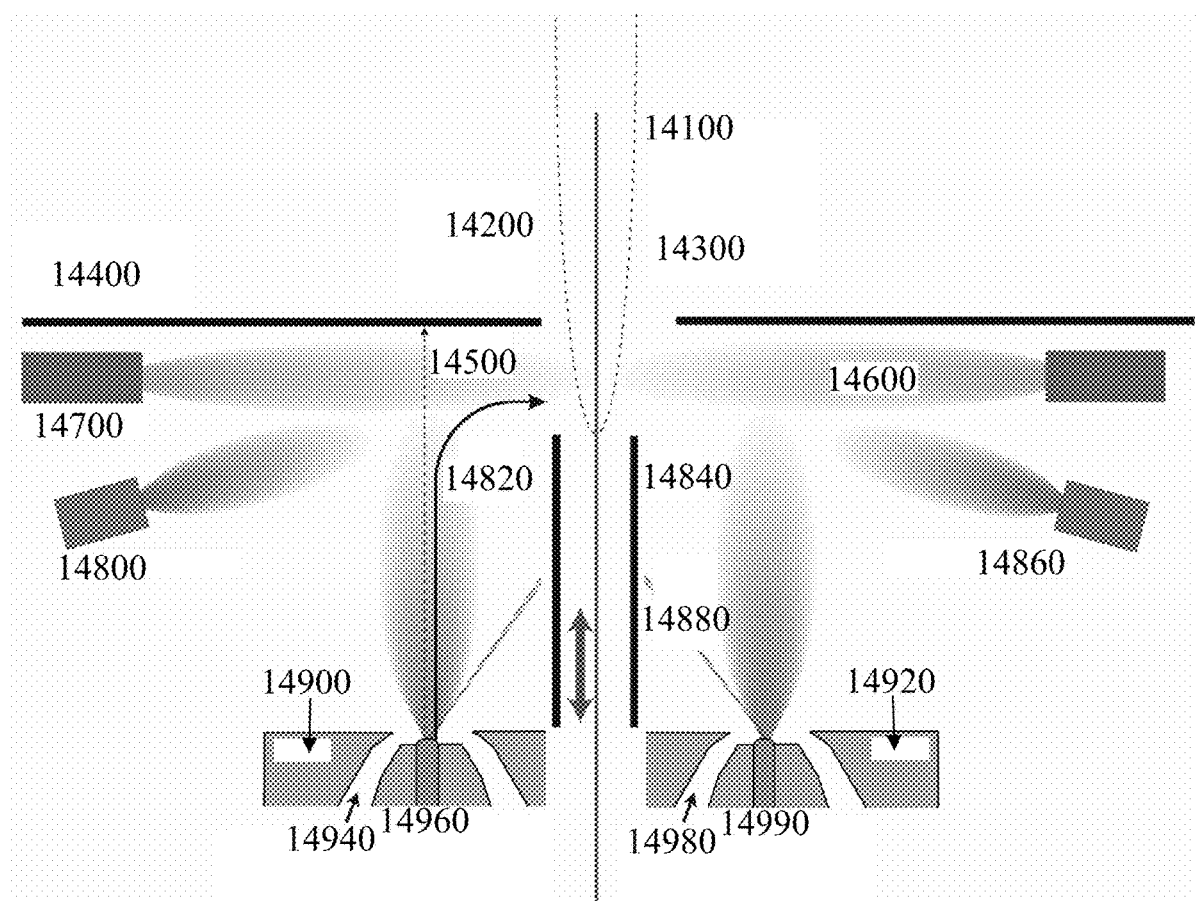
FIG. 14 is a block diagram of an exemplary embodiment of a system 14000.

Certain exemplary embodiments have important features in the area surrounding or near the substrate. In FIGS. 13 and 14 the addition of line-of-sight masking and/or secondary gas jets is illustrated. In these exemplary systems, the modified apparatus blocks the line-of-sight path of particles emanating from the source. These particles have a larger mass than the vapor atoms and molecules leaving the source and thus, by using the carrier gas, secondary carrier gas, and/or plasma activation flux, the vapor atoms can be transported to the substrate while the particles are blocked by the line-of-sight masking. Different orientations of the substrate can be utilized to promote high deposition efficiency, simultaneous coating of the front and back of the substrate and deposition onto a continuous, moving substrate. The masking utilized to block particles also is designed to prevent radiant heat from the source and the plasma from being applied to the substrate. This aids the deposition onto low temperature substrates such as plastics.

FIG. 13 is a block diagram of an exemplary embodiment of a system 13000, which comprises a substantially continuous substrate 13100, a heat/particle shield 13200, non-line of sight LiPON deposition 13300, a particle trajectory 13400, pulsed plasma 13420, nitrogen activation 13500, a vapor atom trajectory 13600, a first secondary gas jet nozzle 13700, particle shield 13720, a second secondary gas jet 13740, a scanning e-beam or resistive heating 13760, a first nozzle 13800, $N_2$ and/or Ar gas 13840, $Li_3PO_4$ source 13860, a second nozzle 13820, $N_2$ and/or Ar gas 13880, $Li_3PO_4$ source 13900. System 13000 is a deposition apparatus utilizing DVD processing apparatus, particle shields, secondary gas jets and/or a pulsed plasma to block line-of-sight particle transport from a source to a substrate and to promote non-line-of-sight deposition of the vapor flux.

FIG. 14 is a block diagram of an exemplary embodiment of a system 14000, which comprises a substantially continuous substrate 14100, a non-line of sight LiPON deposition zone 14200, two sided deposition 14300, a heat/particle shield 14400, a particle trajectory 14500, nitrogen activation 14600, pulsed plasma 14700, a first secondary gas jet 14800, a vapor atom trajectory 14820, particle shield 14840, a second secondary gas jet 14860, a scanning e-beam or resistive heating 14880, a first nozzle 14900, $N_2$ and/or Ar gas 14940, $Li_3PO_4$ source 14960, a second nozzle 14920, $N_2$ and/or Ar gas 14980, $Li_3PO_4$ source 14990.

System 14000 is a deposition apparatus utilizing DVD processing apparatus, particle shields, secondary gas jets and/or a pulsed plasma to block line-of-sight particle transport from a source to a substrate and to promote non-line-of-sight deposition of the vapor flux.

An arrangement where the substrates are located below the height of the crucibles can also be utilized. In this arrangement, the secondary carrier gas jets are used to direct the $Li_3PO_4$ flux down onto the substrates while any particles move upward away from the substrates, FIG. 15.

Figure 15:
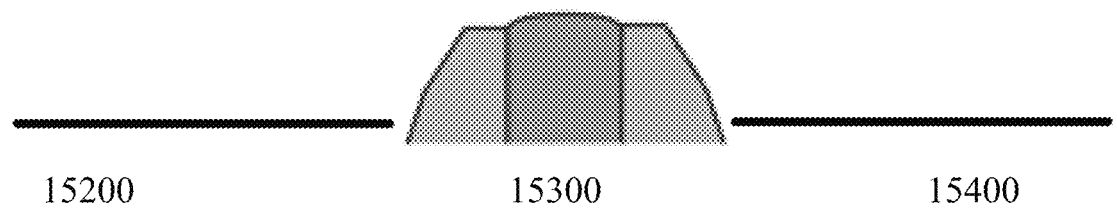
FIG. 15 is a block diagram of an exemplary embodiment of a system 15000.

FIG. 15 is a block diagram of an exemplary embodiment of a system 15000, which comprises $N_2$ and/or Ar gas 15100, a substrate 15200, and a $Li_3PO_4$ source 15300.

System 15000 is a deposition apparatus utilizing DVD processing apparatus, secondary gas jets to direct vapor transport from a source to a substrate located in a non-line-of-sight position below the vapor source.

For all of the above configurations it is also realized that tapered crucible designs can also be utilized as shown in FIG. 14. Such crucibles allow for smaller diameter source rods to be used while still retaining a large evaporation area. The smaller crucible diameter source can be more cost effective to manufacture than larger diameters for some materials.

Figure 16:
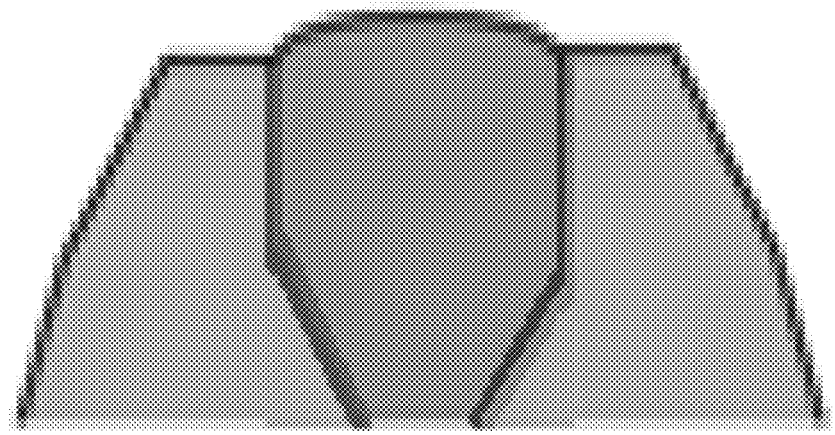
FIG. 16 is a block diagram of an exemplary embodiment of a system 16000.

FIG. 16 is a block diagram of an exemplary embodiment of a system 16000, which comprises a $Li_3PO_4$ source 16100. System 16000 utilizes a tapered crucible design.

Figure 17:
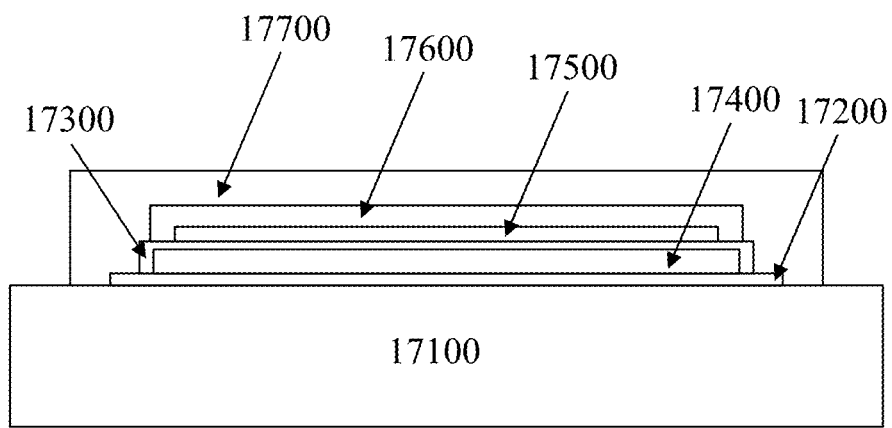
FIG. 17 is a block diagram of an exemplary embodiment of a battery 17000.

FIG. 17 is a block diagram of an exemplary embodiment of a battery 17000, which comprises a substrate 17100, a cathode current collector 17200, an electrolyte 17300, a cathode 17400, an anode 17500, an anode current collector 17600, and a protection layer 17700. Each of cathode current collector 17200, electrolyte 17300, cathode 17400, anode 17500, anode current collector 17600, and a protection layer 17700 can be deposited on substrate 17100 via a DVD process.

In certain exemplary embodiments, battery 17000 comprises electrolyte 17300. Electrolyte 17300 can comprise a thin film of LiPON, which is deposited directly on a circuit board. Electrolyte 17300 can be substantially liquid free. Battery 17000 can be coupled to an electronic circuit comprised by the circuit board. The thin film can be less than 10 μm in thickness. An ionic conductivity for Li ion transport of electrolyte 17300 can be greater than $1 \times 10^{-6}$ S/cm.

Figure 18:
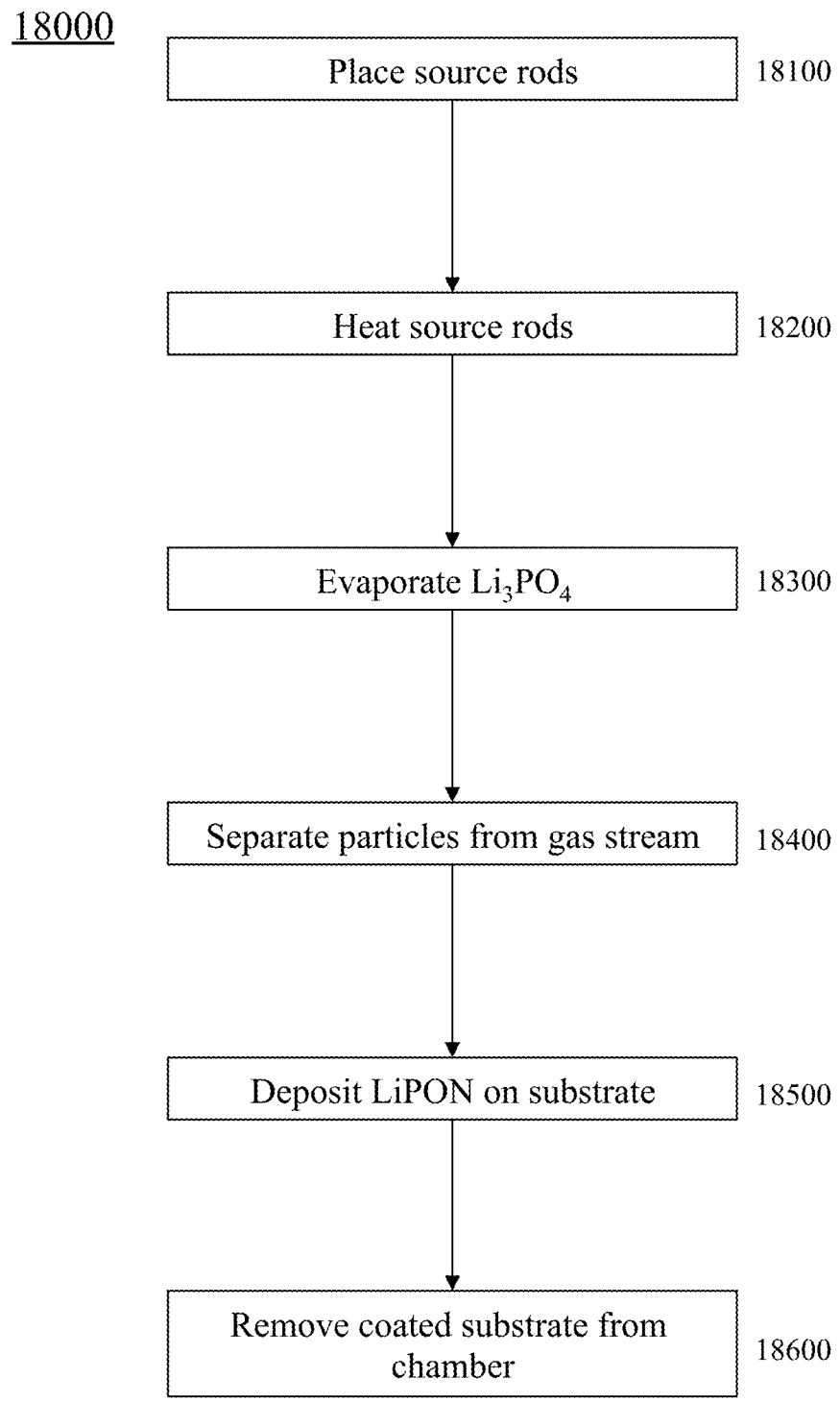
FIG. 18 is a flowchart of an exemplary embodiment of a method 18000.

FIG. 18 is a flowchart of an exemplary embodiment of a method 18000. At activity 18100, source rods can be placed in a DVD chamber.

At activity 18200, the source rods comprising $Li_3PO_4$ can be heated. At activity 18300 the source rods can be evaporated to form a $Li_3PO_4$ gas stream (i.e., vapor flux). Certain exemplary embodiments can comprise:

heating a melt pool sourcing a vapor cloud to a temperature higher than a temperature of the vapor cloud contacting a substrate;

evaporating a plurality of source rods simultaneously to form the thermally evaporated vapor cloud;

indirectly heating a thermally conducting object, the thermally conducting object defining periodic apertures, wherein the vapor cloud is generated by indirectly heating the thermally conducting object The vapor cloud can comprise an inert carrier gas. The vapor cloud can be generated:

from a melt pool that comprises liquid $Li_3PO_4$ and a non-reactive, non-melting openly porous material;

from a melt pool that comprises liquid $Li_3PO_4$ and either silicon or silicon dioxide; and/or via indirect resistive heating.

At activity 18400, particles can be separated from the gas stream. Particles can be separated from a transonic gas stream such that the particles are not deposited on the substrate.

At activity 18500, LiPON from the gas stream and/or other layers can be deposited on a substrate. Certain exemplary embodiments can comprise, via a transonic gas jet, depositing a thin film of LiPON on a substrate via a directed vapor deposition process, the transonic gas jet transporting a thermally evaporated vapor cloud comprising the LiPON, wherein:

the transonic gas jet comprises one of:
substantially entirely nitrogen ($N_2$) gas; or
nitrogen ($N_2$) gas as a dopant in a concentration greater than 10% by volume in an inert carrier gas.

The directed vapor deposition process can have an operating pressure between 1 and 100 Pascals. The directed vapor deposition process can utilize a hollow cathode plasma subsystem that ionizes at least a portion of the vapor cloud. At least some of the thin film of LiPON can be deposited in non-line-of-sight regions on the substrate.

Certain exemplary embodiments can comprise, via a gas jet, depositing a thin film of LiPON on a substrate via a directed vapor deposition process, the gas jet transporting a vapor cloud comprising the LiPON, wherein:

the LiPON is sublimated from solid $Li_3PO_4$ into the vapor cloud via an electron beam flux; and/or any particles that pass through the electron beam flux without completely vaporizing hit a plate heated by the electron beam flux, the plate having a temperature exceeding a vapor pressure of the particles such that the particles vaporize.

Certain exemplary embodiments can comprise, via a primary gas jet, depositing a thin film of LiPON on a substrate via a directed vapor deposition process, the gas jet transporting a thermally evaporated vapor cloud comprising the LiPON, wherein a secondary carrier gas jet causes the vapor cloud to deposit on the substrate, wherein the substrate is located at an elevation below a crucible from which the vapor cloud is emitted.

At activity 18600, the coated substrate can be removed from the DVD chamber.

Definitions

When the following terms are used substantively herein, the accompanying definitions apply. These terms and definitions are presented without prejudice, and, consistent with the application, the right to redefine these terms during the prosecution of this application or any application claiming priority hereto is reserved. For the purpose of interpreting a claim of any patent that claims priority hereto, each definition (or redefined term if an original definition was amended during the prosecution of that patent), functions as a clear and unambiguous disavowal of the subject matter outside of that definition.

a—at least one.

activation energy—the minimum amount of energy required to start a chemical reaction.

activity—an action, act, step, and/or process or portion thereof.

adapter—a device used to effect operative compatibility between different parts of one or more pieces of an apparatus or system.

and/or—either in conjunction with or in alternative to.

anode—a positively charged electrode via which the electrons leave a device.

aperture—an opening or hole defined by an object.

apparatus—an appliance or device for a particular purpose associate—to join, connect together, and/or relate.

below—under in elevation.

bias—a voltage or current applied to an electrical device and/or system.

bipolar—an electrical current that may assume either of two polarities, neither of which is zero.

can—is capable of, in at least some embodiments.

carrier gas—a substance that acts to convey a coating material in a directed vapor deposition chamber, which substance is in a state such that the substance expands freely to fill any space available, irrespective of a quantity of the substance.

cathode—a negatively charged electrode by which electrons enter an electrical device.

cause—something that produces an effect, result, or condition.

chamber—a substantially enclosed space or cavity.

change—to make different.

choked nozzle—a spout at a terminus of a pipe, hose, or tube constructed to control a jet of a gas or liquid and severely restricts flow of the gas or liquid.

circuit board—a substrate that mechanically supports electronic components using conductive tracks, pads and other features etched and/or laminated thereon.

coat—to provide an object with a layer over a surface of the object.

coating material—a substance to be applied as a layer to a substrate.

coaxial—having a common axis.

component—a part of a larger whole.

comprising—including but not limited to.

concentration—abundance of a constituent as a percentage of a mixture.

configure—to make suitable or fit for a specific use or situation.

connect—to join or fasten together.

constructed to—designed or made for a specific use or situation.

contact—to physically touch.

convert—to transform, adapt, and/or change.

coupleable—capable of being joined, connected, and/or linked together.

coupling—linking in some fashion.

crucible—a container constructed to hold a substance, which container is constructed to allow the substance to be subjected to a gasifying temperature.

define—to establish the outline, form, or structure of.

deposit—to put a layer on a surface of an object.

determine—to obtain, calculate, decide, deduce, and/or ascertain.

device—a machine, manufacture, and/or collection thereof.

direct—to regulate a course of something.

direction—a line along which something moves.

directly—substantially with nothing in between.

directed vapor deposition process—a method via which a layer of a coating material is put on a surface of a substrate, wherein the layer is formed via condensation of an evaporated substance on the surface of the substrate, which evaporated substance is conveyed to the surface of the substrate via a carrier gas stream.

dopant—an element or compound that is inserted into a gas stream.

electrically conductive—constructed to convey electricity over a distance and having a resistivity of less than approximately 1 m Ωcm.

electrically non-conductive—constructed to substantially not conduct electricity and having a resistivity of greater than approximately 1 m Ωcm.

electrolyte—a liquid or gel that contains ions and can be decomposed by electrolysis.

electron beam—a directed stream of electrons in a gas or vacuum.

electron beam flux—an emitted stream of electrons from an electron beam source.

electron beam source—a system constructed to emit a stream of electrons in a gas or vacuum.

electronic circuit—a system comprising at least one semiconductor in one or more resistors, transistors, capacitors, inductors and/or diodes, which are electrically coupled via conductive wires or traces through which an electric current can flow.

elevation—a height above a predetermined level.

emit—to give off something.

emission direction—a primary course along which a plasma source conveys a plasma flux.

energy—power to provide heat, light, and/or work.

entirely—completely.

evaporate—to cause a change of state from a solid to a gas.

exceed—to be greater than.

expose—to make something accessible to a particular influence.

form—to cause development of something.

gas—a state of matter in which the matter is in a form of a vapor and that has neither independent shape nor volume but tends to expand indefinitely unless constrained by a barrier.

gas jet nozzle—a pipe or duct that directs a gas and accelerates the flow of the gas.

generate—to create, produce, give rise to, and/or bring into existence.

heat—to impart kinetic energy to an object and/or system such that a temperature of the object and/or system is thereby increased.

heat energy—nonmechanical energy with reference to a temperature difference between a system and its surroundings or between two parts of the same system.

higher—greater in magnitude.

hit—to impact.

hollow cathode plasma subsystem—a system comprising an electrode that defines a cavity and is constructed to impart energy to a material and thereby generate a plasma.

hot walled kettle—a vessel that acts as a melt pool in a directed vapor deposition system; the vessel comprises a roof that is substantially impervious to vapor emission; the vessel comprises an elbowed sidewall vent that causes a vapor emitted from the vessel to turn by approximately ninety degrees at least twice prior to deposition on a substrate.

impart—to transfer to.

indirect—substantially without touching.

indirectly heating—a imparting thermal energy without contacting a hot surface, such as via indirect electron beam heating.

inert carrier gas—a vapor present in a chamber that is substantially non-reactive with other substances in the chamber. For example, an inert carrier gas can comprise a noble gas (i.e., helium, argon, neon, xenon, krypton, radon, and/or oganesson) and/or gaseous nitrogen, etc.

inject—to introduce something into a directed vapor deposition chamber.

install—to connect or set in position and prepare for use.

intermingle—to mix together.

ion conducting—a material via which charged atoms or molecules can permeate.

ionic conductivity—a measure of an ability of an ionized material to move through a substance.

ionize—to convert atoms from an uncharged state to a charged state, typically via changes in an electrode count in proximity to atom nuclei.

layer—a quantity of material placed on the surface of something.

LiPON—lithium phosphorus oxynitride.

liquid free—substantially lacking any free flowing substance.

locate—to establish a position of something relative to something else.

material feeder—a subsystem that transfers a substance into a directed vapor deposition system.

may—is allowed and/or permitted to, in at least some embodiments.

melt pool—a reservoir constructed to receive a coating substance, wherein energy can be imparted to the melt pool to evaporate and/or sublimate the coating substance.

method—a process, procedure, and/or collection of related activities for accomplishing something.

non-line-of-site regions—portions of something that are not visible to a human via observation from a fixed point in space.

non reactive, non-melting openly porous material—a substance that will remain in a substantially solid state at temperatures utilized in a directed vapor technology process; such materials can comprise zirconia and/or tantalum, etc.

nozzle—a device that control a direction or flow characteristics of a vapor (especially to increase velocity) as the vapor enters a directed vapor deposition chamber.

operating pressure—a measure of force that a gas exerts upon a chamber in which the gas is held.

parallel—extending substantially in a same direction, approximately equidistant at all points, and substantially not converging or diverging.

particle—a small piece of solid matter.

particle-separating cyclone—a centrifugal device for separating solid particles from gases. The device typically has a substantially cylindrical portion with a substantially conical portion thereunder.

periodic—occurring at intervals.

plasma—One of four main states of matter, similar to a gas, but consisting of positively charged ions with most or all of their detached electrons moving freely about.

plasma current—an electron flow applied to a plasma source plasma flux—a flow of plasma from a plasma source.

plasma generated ions—positively charged atoms or molecules created and conveyed by a plasma source.

plasma source unit—a system constructed to impart energy to a coating material and thereby generate a plasma.

plate—a substantially flat piece of material.

plurality—the state of being plural and/or more than one.

predetermined—established in advance.

pressure—a substantially continuous physical force exerted on or against an object by something in contact with the object.

promote—to act as a facilitator for something in a directed vapor deposition system.

provide—to furnish, supply, give, and/or make available.

pulsed—occurring in periodic bursts.

repeatedly—again and again; repetitively.

resistive heating—imparting thermal energy via an electrical current passing through a conductor.

rod—a bar of a material.

secondary—supplemental in addition to something that is primary in a directed vapor deposition system.

separate—to isolate from a mixture.

set—a related plurality.

simultaneously—occurring at substantially a same time as something else.

source—a fount from which something is emitted.

source rods—substantially cylindrical objects that provide a predetermined material (e.g., LiPON) to a deposition chamber.

source vapor—a gaseous stream that comprises a coating material to be applied as a layer to a substrate.

stream—a flow of something.

sublimated—To be transformed directly from a solid to a gas substantially without passing through a liquid phase.

substantially—to a great extent or degree.

substrate—a substance or layer upon which one or more predetermined layers are deposited.

support—to bear the weight of, especially from below.

system—a collection of mechanisms, devices, machines, articles of manufacture, processes, data, and/or instructions, the collection designed to perform one or more specific functions.

taper—a diminishment in thickness in one portion of an object relative to another portion of the object.

temperature—degree of hotness or coldness measured on a definite scale relative to a standard.

thermally conducting object—something that transfers heat with relatively low resistance.

thermally conductive material—a substance with a relatively low resistance to heat energy transfer.

thermally conducting rod—a bar of material with a relatively low resistance to heat energy transfer.

thermally evaporated—changed from a liquid state to a gaseous state via adding heat energy and/or increasing temperature.

thickness—a distance between opposite sides of an object.

thin film—a layer of material having a thickness of less than 200 microns.

transonic gas jet—a stream of vapor that has a velocity approximately the speed of sound, i.e. 965-1,236 km/h (600-768 mph).

transport—conveyance through a substance between electrodes.

vacuum—a space in which the pressure is lower than atmospheric pressure.

vapor cloud—a gaseous substance in a directed vapor deposition chamber.

vaporize—to convert via an application of energy from a solid and/or liquid state into a gas.

vapor pressure—pressure exerted by a vapor in thermodynamic equilibrium with its condensed phases (solid or liquid) at a given temperature in a closed system.

vapor source—a crucible from which gaseous stream emanates, the gaseous stream comprising a coating material to be applied as a layer to a substrate.

via—by way of and/or utilizing.

voltage—an electrical potential expressed in volt units.

wall—an upright partition with a height and length greater than its thickness and serving to enclose, divide, or define an area.

Note

Still other substantially and specifically practical and useful embodiments will become readily apparent to those skilled in this art from reading the above-recited and/or herein-included detailed description and/or drawings of certain exemplary embodiments. It should be understood that numerous variations, modifications, and additional embodiments are possible, and accordingly, all such variations, modifications, and embodiments are to be regarded as being within the scope of this application.

Thus, regardless of the content of any portion (e.g., title, field, background, summary, description, abstract, drawing figure, etc.) of this application, unless clearly specified to the contrary, such as via explicit definition, assertion, or argument, with respect to any claim, whether of this application and/or any claim of any application claiming priority hereto, and whether originally presented or otherwise:

there is no requirement for the inclusion of any particular described or illustrated characteristic, function, activity, or element, any particular sequence of activities, or any particular interrelationship of elements;

no characteristic, function, activity, or element is "essential";

any elements can be integrated, segregated, and/or duplicated;

any activity can be repeated, any activity can be performed by multiple entities, and/or any activity can be performed in multiple jurisdictions; and any activity or element can be specifically excluded, the sequence of activities can vary, and/or the interrelationship of elements can vary.

Moreover, when any number or range is described herein, unless clearly stated otherwise, that number or range is approximate. When any range is described herein, unless clearly stated otherwise, that range includes all values therein and all subranges therein. For example, if a range of 1 to 10 is described, that range includes all values therebetween, such as for example, 1.1, 2.5, 3.335, 5, 6.179, 8.9999, etc., and includes all subranges therebetween, such as for example, 1 to 3.65, 2.8 to 8.14, 1.93 to 9, etc.

When any claim element is followed by a drawing element number, that drawing element number is exemplary and non-limiting on claim scope. No claim of this application is intended to invoke paragraph six of 35 USC 112 unless the precise phrase "means for" is followed by a gerund.

Any information in any material (e.g., a United States patent, United States patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such material is specifically not incorporated by reference herein.

Accordingly, every portion (e.g., title, field, background, summary, description, abstract, drawing figure, etc.) of this application, other than the claims themselves, is to be regarded as illustrative in nature, and not as restrictive, and the scope of subject matter protected by any patent that issues based on this application is defined only by the claims of that patent.

What is claimed is:

1. A method comprising:
via a transonic gas jet, depositing a thin film of LiPON on a substrate via a directed vapor deposition process, the transonic gas jet transporting a thermally evaporated vapor cloud comprising the LiPON, wherein:
the transonic gas jet comprises one of:
substantially entirely nitrogen ($N_2$) gas; or
nitrogen ($N_2$) gas as a dopant in a concentration greater than 10% by volume in an inert carrier gas;
particles are separated from the transonic gas stream such that the particles are not deposited on the substrate; and
a $Li_3PO_4$ source from which $Li_3PO_4$ in the thermally evaporated vapor cloud is derived surrounds a tantalum rod in a nozzle that sources the LiPON.

2. The method of claim 1, further comprising:
heating a melt pool sourcing the vapor cloud to a temperature higher than a temperature of the vapor cloud contacting the substrate.

3. The method of claim 1, further comprising:
evaporating a plurality of source rods simultaneously to form the thermally evaporated vapor cloud.

4. The method of claim 1, further comprising:
indirectly heating a thermally conducting object, the thermally conducting object defining periodic apertures, wherein the vapor cloud is generated by indirectly heating the thermally conducting object.

5. The method of claim 1, wherein:
the vapor cloud is generated from a melt pool that comprises liquid $Li_3PO_4$ and a non-reactive, non-melting openly porous material.

6. The method of claim 1, wherein:
the vapor cloud is generated from a melt pool that comprises liquid $Li_3PO_4$ and either silicon or silicon dioxide.

7. The method of claim 1, wherein:
the vapor cloud is generated via indirect resistive heating.

8. The method of claim 1, wherein:
the directed vapor deposition process has an operating pressure between 1 and 100 Pascals.

9. The method of claim 1, wherein:
the vapor cloud comprises the inert carrier gas.

10. The method of claim 1, wherein:
the directed vapor deposition process utilizes a hollow cathode plasma subsystem that ionizes at least a portion of the vapor cloud.

11. The method of claim 1, wherein:
at least some of the thin film of LiPON is deposited in non-line-of-sight regions on the substrate.

12. The method of claim 1, wherein:
the transonic gas jet is fed by a pair of material feeders, each of the pair of material feeders conveying a separate evaporant material, the thermally evaporated vapor cloud comprising evaporant material from each of the pair of material feeders.

13. The method of claim 1, wherein:
a $Li_3PO_4$ source from which $Li_3PO_4$ in the thermally evaporated vapor cloud is derived is heated via a thermally conductive material impinged upon by an e-beam.

* * * * *